(12) United States Patent
Shin et al.

(10) Patent No.: US 10,146,443 B2
(45) Date of Patent: Dec. 4, 2018

(54) MEMORY CONTROLLER

(71) Applicants: SK hynix Inc., Icheon (KR); Korea Advanced Institute of Science and Technology, Daejeon (KR)

(72) Inventors: Won-Gyu Shin, Seoul (KR);
Jung-Whan Choi, Daejeon (KR);
Lee-Sup Kim, Daejeon (KR);
Young-Suk Moon, Gyeoggi-do (KR);
Yong-Kee Kwon, Gyeonggi-do (KR)

(73) Assignees: SK HYNIX INC., Icheon (KR);
KOREA ADVANCED INSTITUTE OF SCIENCE AND TECHNOLOGY, Daejeon (KR)

( * ) Notice: Subject to any disclaimer, the term of this patent is extended or adjusted under 35 U.S.C. 154(b) by 116 days.

(21) Appl. No.: 14/868,211

(22) Filed: Sep. 28, 2015

(65) Prior Publication Data
US 2016/0162200 A1   Jun. 9, 2016

(30) Foreign Application Priority Data

Dec. 3, 2014   (KR) .................. 10-2014-0171858

(51) Int. Cl.
*G06F 12/08* (2016.01)
*G06F 3/06* (2006.01)

(52) U.S. Cl.
CPC .......... *G06F 3/0611* (2013.01); *G06F 3/0658* (2013.01); *G06F 3/0673* (2013.01); *G06F 12/08* (2013.01)

(58) Field of Classification Search
CPC ...................................... G06F 12/08
USPC ....................................... 711/169
See application file for complete search history.

(56) References Cited

U.S. PATENT DOCUMENTS

| | | | | |
|---|---|---|---|---|
| 5,394,541 A * | 2/1995 | Chesley | ............. | G06F 13/4243 711/111 |
| 5,903,916 A * | 5/1999 | Pawlowski | ......... | G06F 13/1626 365/189.04 |
| 6,052,134 A * | 4/2000 | Foster | ................. | G06F 12/0215 345/533 |
| 2002/0056022 A1* | 5/2002 | Leung | ................. | G06F 12/0893 711/106 |
| 2005/0257005 A1* | 11/2005 | Jeddeloh | ............. | G06F 12/0215 711/115 |
| 2008/0056036 A1* | 3/2008 | Lee | ....................... | G11C 11/406 365/201 |

(Continued)

FOREIGN PATENT DOCUMENTS

KR   10-2007-0048337 A   5/2007

OTHER PUBLICATIONS

Donghyuk Lee et al., "Tiered-Latency DRAM: A Low Latency and Low Cost DRAM Architecture", High Performance Computer Architecture (HPCA2013), 2013 IEEE 19th International Symposium on High Performance Computer Architecture, Feb. 23, 2013, Washington, DC.

*Primary Examiner* — Gautam Sain (57) ABSTRACT

A memory controller includes a scheduler that decides a processing order of a plurality of requests provided from an external device with reference to a timing parameter value for each of the requests; and a timing control circuit that adjusts the timing parameter value according to a corresponding address to access a memory device, the corresponding address being used to process a corresponding request of the plurality of requests.

13 Claims, 8 Drawing Sheets

(56) References Cited

U.S. PATENT DOCUMENTS

2010/0271891 A1    10/2010   Dell et al.
2013/0254475 A1*   9/2013   Perego .............. G11C 11/40603
                                                                             711/106
2014/0143508 A1*   5/2014   Kwon ...................... G06F 12/00
                                                                             711/147
2014/0281202 A1*   9/2014   Hunter .............. G11C 11/40611
                                                                             711/106

* cited by examiner

MEMORY CONTROLLER

CROSS-REFERENCE TO RELATED APPLICATIONS

The present application claims priority under 35 U.S.C § 119(a) to Korean Patent Application Number 10-2014-0171858, filed on Dec. 3, 2014, in the Korean Intellectual Property Office, which is incorporated herein by reference in its entirety as set forth in full.

BACKGROUND

1. Technical Field

The present disclosure relates to a memory controller. Particularly, embodiments of the present disclosure relate to a memory controller capable of changing values of timing parameters in consideration of a time lapsed after a refresh operation is completed.

2. Related Art

In general, a DRAM device includes a plurality of banks. When requests from an external device, e.g., host, are properly distributed to the plurality of banks, the occurrence probability of a bottleneck phenomenon is reduced. However, a bottleneck phenomenon may occur when a plurality of requests are concentrated on one bank as a result of trying to sequentially process these requests.

When the plurality of requests are related to the same row address, the occurrence probability of the bottleneck phenomenon is relatively reduced since a row access operation is performed only once, while a column access operation is performed several times.

However, it may not be possible to avoid delay of processing time when the plurality of requests are related to row addresses that are different from one another since a separate row access operation is performed for each request.

Figure 1:
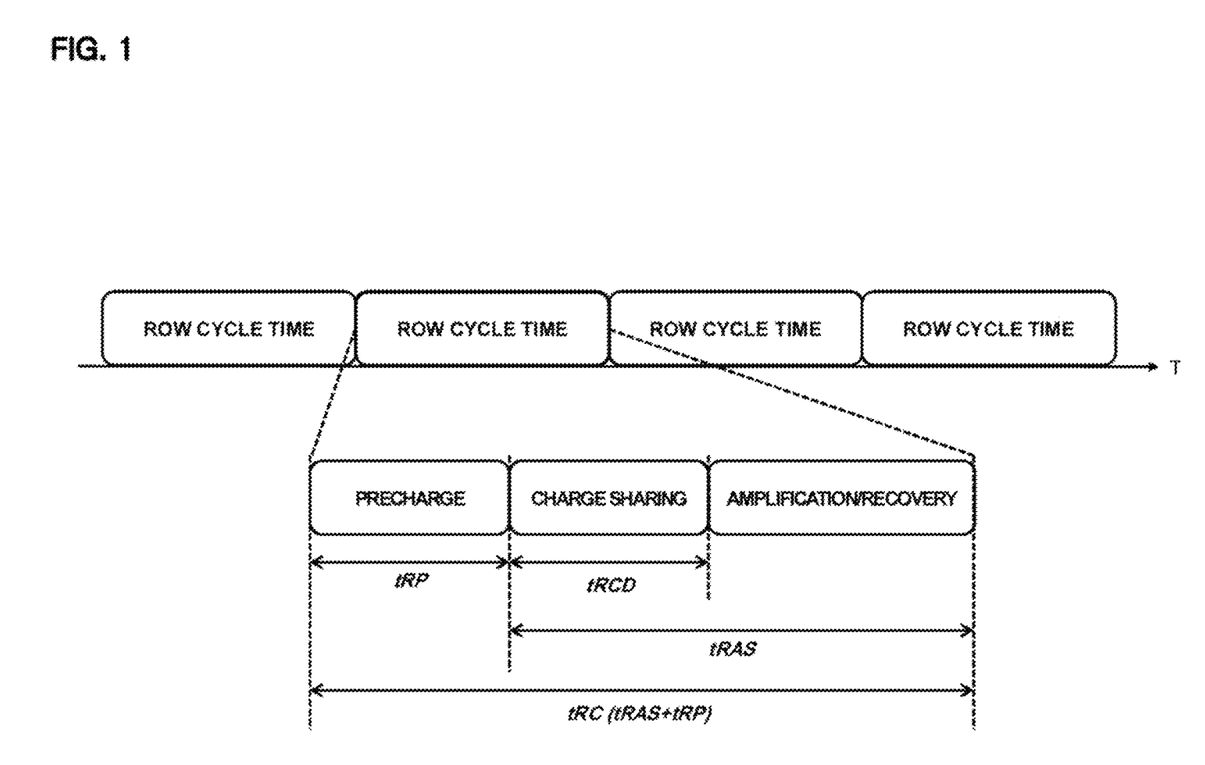
FIG. 1 illustrates a timing diagram for an exemplary row access operation of a DRAM device.

FIG. 1 is an exemplary timing graph related to a row access operation of a DRAM device. The timing graph illustrated shows multiple row access operations (indicated as "row cycle time") that may be performed serially over time.

As further illustrated in FIG. 1, a particular row access operation, which may require a certain amount (e.g., "row cycle time" in FIG. 1) of time to complete, may actually involve multiple operations related to precharge, charge sharing, amplification, and recovery stages, wherein when each row access operation is performed timing parameters such as tRP (row precharge time), tRCD (row address to column address delay), tRAS (row active time), and tRC (row cycle time) should be satisfied as illustrated in FIG. 1.

Since a conventional memory controller applies constant timing parameters to multiple row access operations, when the multiple row access operations are performed as illustrated in FIG. 1, it is difficult to avoid a bottleneck phenomenon. As a result, operational performance of a DRAM device is deteriorated.

SUMMARY

Embodiments of the present disclosure are directed to a memory controller capable of reducing a bottleneck phenomenon by variably adjusting timing parameters for each of multiple row access operations to be performed.

In one embodiment of the present invention, a memory controller includes: a scheduler that decides a processing order of a plurality of requests provided from an external device with reference to a timing parameter value for each of the requests; and a timing control circuit that adjusts the timing parameter value according to a corresponding address to access a memory device, the corresponding address being used to process a corresponding request of the plurality of requests.

According to embodiments of the present disclosure, in a row access operation, timing parameters that are applied are adjusted in consideration of, for example, amount of time that has lapsed after a refresh operation is completed. As a result, it is possible to improve operational performance of a memory device as compared with the conventional memory device in which timing parameters are constant and statically applied.

BRIEF DESCRIPTION OF THE DRAWINGS

Features, aspects, and embodiments are described in conjunction with the attached drawings, in which.

DETAILED DESCRIPTION

Hereinafter, a memory controller according to embodiments of the present disclosure will be described in detail with reference to the accompanying drawings. In the following description, the same reference numerals are used to designate substantially the same elements.

Before describing embodiments of the present disclosure, an operation of a DRAM device and a phenomenon according to the operation, from which the present disclosure is derived, will be firstly described.

As illustrated in FIG. 1, a row access operation of a DRAM device includes precharge, charge sharing, and amplification/recovery operations.

(1) In the precharge operation, a voltage of a bit line is charged to ½ of a power supply voltage VDD. At this time, the bit line is separated from a cell capacitor.

(2) In the charge sharing operation, the bit line and the cell capacitor are coupled to each other, so that charge is shared between the bit line and the cell capacitor. When information stored in a cell is 1, a voltage of the cell capacitor is reduced and the voltage of the bit line is increased by the charge sharing. On the other hand, when the information stored in the cell is 0, the voltage of the cell capacitor is increased and the voltage of the bit line is reduced by the charge sharing. Hereinafter, an operation will be described based on the case in which the information stored in the cell is 1.

(3) In the amplification operation, the bit line voltage larger than a precharge voltage 0.5×VDD is increased to the power supply voltage VDD by an operation of a sense amplifier, and in the recovery operation, charge corresponding to the power supply voltage VDD is stored in the cell capacitor.

Figure 2A:
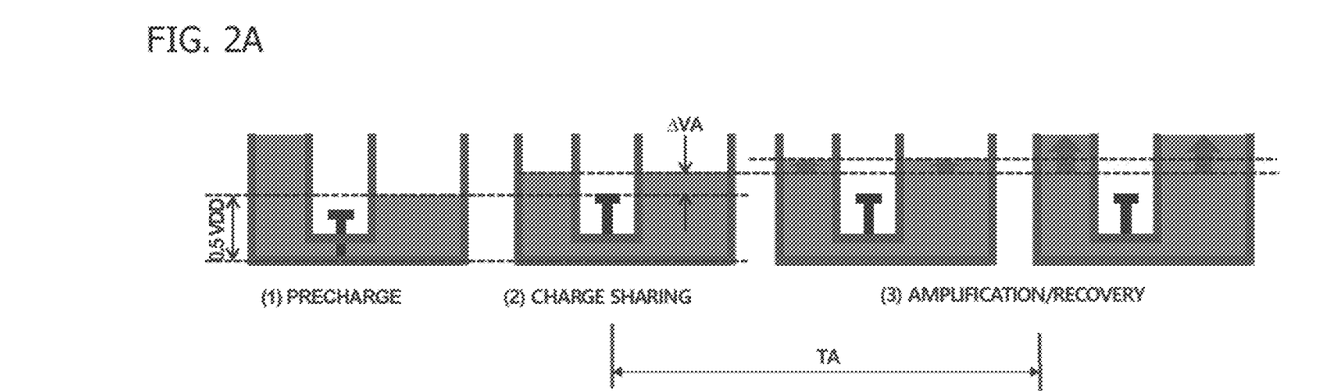
FIGS. 2A and 2B are diagrams comparatively illustrating a charge amount of a capacitor and a row access operation speed.
Figure 2B:
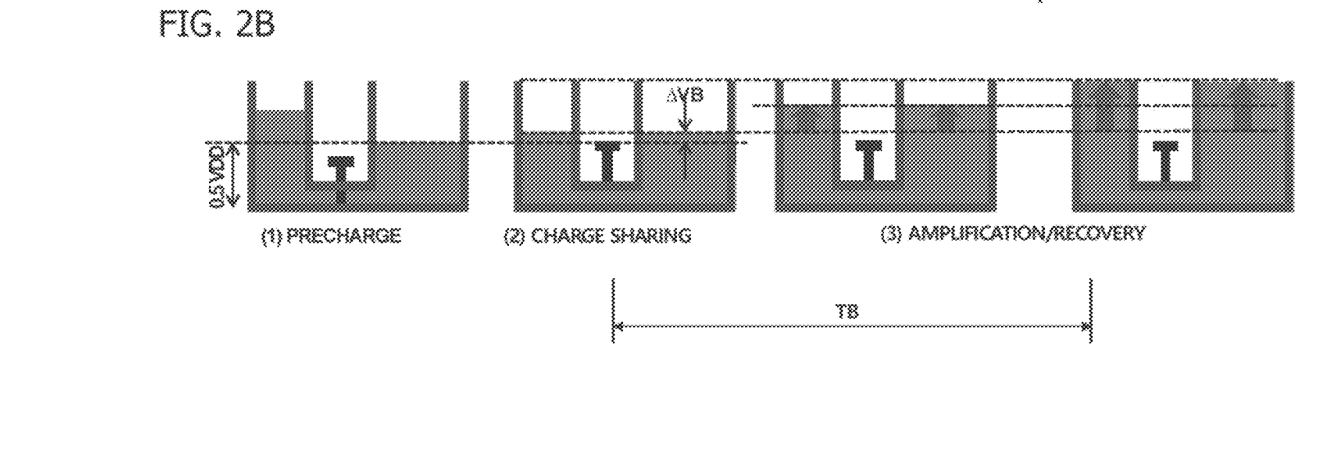

FIGS. 2A and 2B are diagrams comparatively illustrating a charge amount remaining in a cell capacitor with respect to time as various operations are being performed. In particular, two scenarios are illustrated in FIG. 2:

FIG. 2A illustrates the case in which a row access operation (which includes precharge, charge sharing, and amplification/recovery operations) is performed on the cell capacitor, which begins with a fully stored charge in the cell capacitor. FIG. 2B illustrates the case in which the row access operation is performed on the cell capacitor, which begins with only a partially stored charge (e.g., with less than fully stored charge) in the cell capacitor.

As illustrated in FIGS. 2A and 2B, in the charge sharing operation, the voltage of the bit line changes according to the amount of charge stored in the cell capacitor. That is, a difference between a precharge voltage 0.5×VDD and the voltage of the bit line after the charge sharing operation is performed is larger in FIG. 2A than in FIG. 2B (e.g., ΔVA>ΔVB).

Then in the amplification/recovery operation, the voltage of the bit line is increased to the power supply voltage VDD by an operation of the sense amplifier. Since an initial level of the voltage of the bit line after the charge sharing operation is performed is higher in FIG. 2A than in FIG. 2B, the time required for reaching the power supply voltage in FIG. 2A is shorter than in FIG. 2B (e.g., TA<TB).

A conventional timing parameter is typically set to be relatively long in order to accommodate for situations in which the amount of charge in the cell capacitor has been reduced. Further, when an amount of charge to be stored in the cell capacitor is relatively large, additional time may be required even after the amplification operation is completed.

In this regard, embodiments of the present disclosure apply variable timing parameters according to the amount of charge stored in the cell capacitor.

In an embodiment of the present disclosure, the amount of charge stored in the cell capacitor is determined based on the amount of time that has lapsed (or simply "time lapsed") after a refresh operation (or simply "refresh") is completed.

Figure 3:
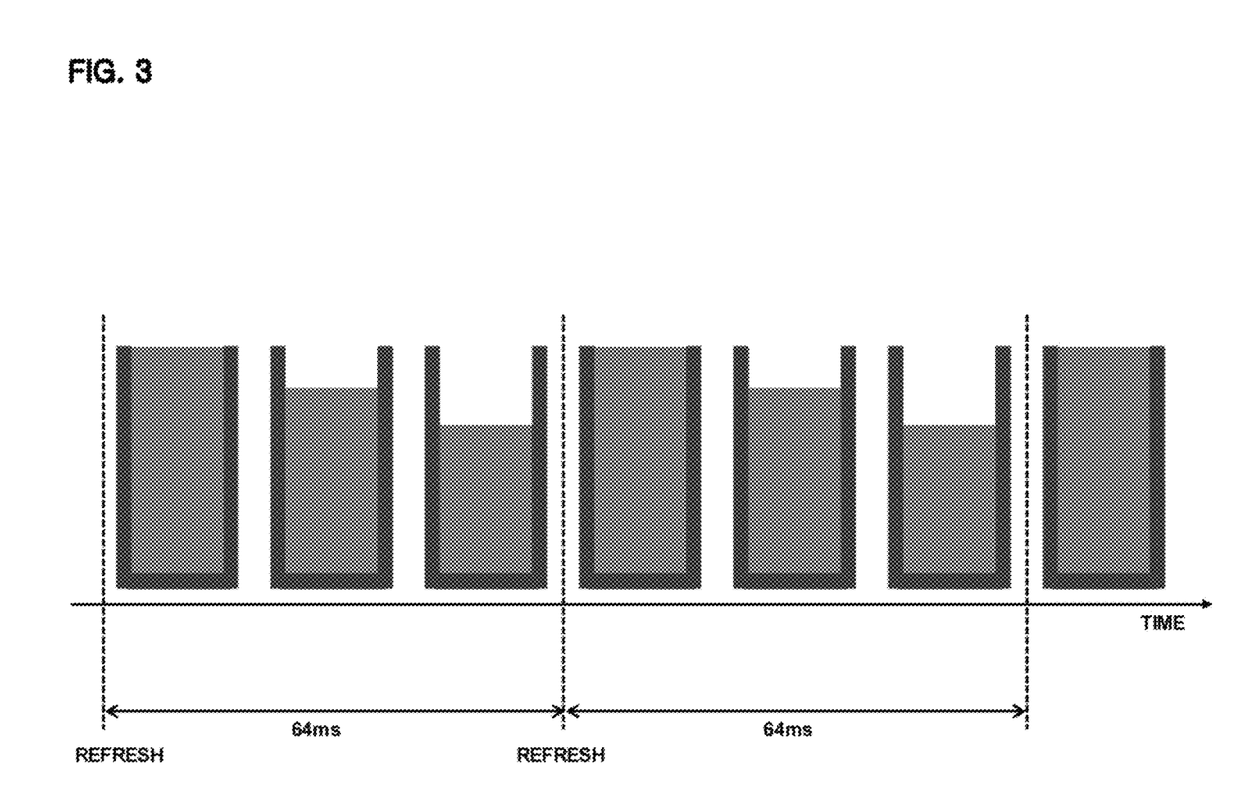
FIG. 3 is a diagram illustrating a charge amount of a DRAM capacitor according to a time lapsed after a refresh operation is completed.

FIG. 3 is a diagram illustrating a change in a charge amount of a cell capacitor over a time span (e.g., time lapse) following completion of a refresh operation.

In FIG. 3, it is assumed that data "1" has initially been stored in a cell. As illustrated in FIG. 3, in each row of a DRAM device, a refresh operation is performed for each 64 msec, and thus the amount of charge stored in the cell capacitor is gradually reduced over the course of 64 msec due to discharge according to the passage of time after the refresh operation is completed. At the start of next 64 msec, the cell is again refreshed to store data "1."

However, when data "0" has been stored in the cell, the amount of charge stored in the cell capacitor is gradually increased due to charge injection from an exterior source according to the passage of time after the refresh operation is completed. In this scenario, a refresh operation results in the cell storage having data "0" (e.g., zero or near zero charge).

In an embodiment, when a row access operation is performed for a specific row address based on the examples illustrated in FIG. 2 and FIG. 3, a variable timing parameter is applied based on a time lapsed (e.g., the amount of time that has lapsed) after a refresh operation corresponding to the specific row address is completed.

For example, when the time lapsed after the refresh operation is completed is relatively long, a longer timing parameter is applied, and when the time lapsed after the refresh operation is completed is relatively short, a shorter timing parameter is applied.

Figure 4:
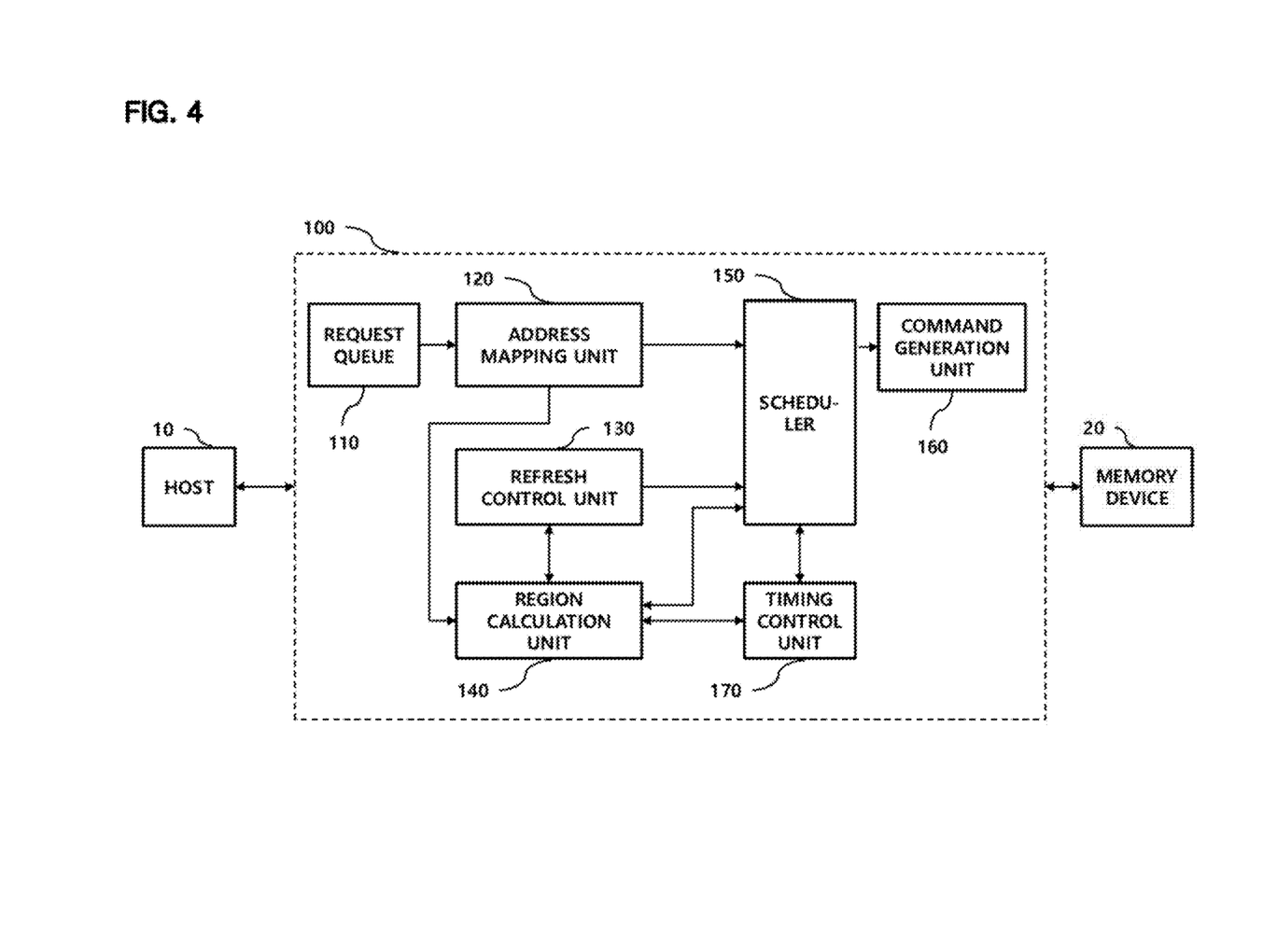
FIG. 4 is a block diagram of a memory system including a memory controller according to an embodiment of the present disclosure.

FIG. 4 is a block diagram of a memory system including a memory controller 100 according to an embodiment of the present disclosure. In some embodiments, the memory controller 100, as well other one or more of the other components of the memory system, may be implemented using specially designed circuitry, for example, digital circuitry.

The memory controller 100 controls operations of read, write and the like for a memory device 20 according to requests from a host 10. The memory controller 100 includes a request queue 110, an address mapping circuit 120, a refresh control circuit 130, a region determination circuit 140, a scheduler 150, a command generation circuit 160, and a timing control circuit 170.

The request queue 110 stores the requests from the host 10.

The address mapping circuit 120 converts a logical address requested by the host 10 into a physical address of the memory device 20. The physical address may include a bank address, a row address, and a column address.

The refresh control circuit 130 controls a refresh operation to be sequentially performed for each row of the memory device 20 for each refresh cycle (for example, 64 msec). The refresh control circuit 130 stores a row address in which refresh has been performed for each refresh cycle.

The region determination circuit 140 calculates the amount of time that has lapsed (e.g., a "time lapsed") after a refresh operation corresponding to a row address related to a request is completed, with reference to operational results of the address mapping circuit 120 and the refresh control circuit 130. Note that in some embodiments, the phrase "time lapsed" may be in reference to the amount of time that lapses between succeeding refresh operations.

In the present embodiment, each row address of the memory device 20 is designated to any one of a plurality of regions according to a time lapsed after a corresponding refresh operation is completed. In row access, the same timing parameters may be applied to row addresses belonging to the same region. A region determination method of the region determination circuit 140 will be described in detail later.

The scheduler 150 decides a processing order of the requests provided from the host 10.

An operation for processing each of the requests provided from the host 10 may be divided into several sub-operations. For example, an operation for processing a read request may be divided into row access and column access operations, and the row access operation may be subdivided into an active operation, a precharge operation, a read operation (or an amplification/recovery operation) and the like.

The scheduler 150 selects any one of the subdivided operations corresponding to each request.

The command generation circuit 160 generates an internal command to perform the subdivided operation selected by the scheduler 150, and controls the memory device 20 using the internal command.

The scheduler 150 allows a timing parameter decided by a memory standard to be conformed when each subdivided operation is performed with reference to an operational result of a timing control circuit 170. For example, the scheduler 150 may allow the read operation to be performed when a time corresponding to tRCD passes after the active operation is completed.

The timing control circuit 170 decides a value of a timing parameter according to a row address related to a selected operation. In an embodiment, the timing control circuit 170 may designate a value of a timing parameter (for example, tRAS) according to a region to which a row address belongs.

For example, when the scheduler 150 selects the active operation and notifies the command generation circuit 160 and the timing control circuit 170 of selecting the active operation, the timing control circuit 170 may count a value of the timing parameter tRCD, and provide a completion signal corresponding to the counting to the scheduler 150 when the counting is completed. If the completion signal is received, the scheduler 150 may select the read operation following the active operation and notify the command generation circuit 160 and the timing control circuit 170 of selecting the read operation.

In the present embodiment, the timing control circuit 170 decides a value of a timing parameter according to a region including a row address with reference to a region determination result of the region determination circuit 140.

Figure 5:
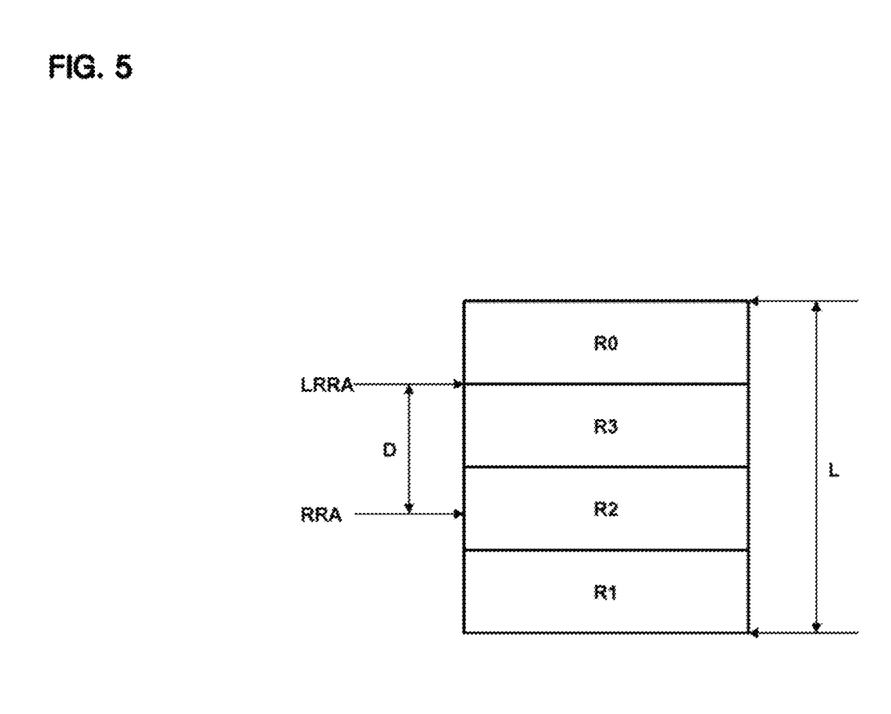
FIG. 5 and FIG. 6 are diagrams illustrating a region determination operation according to embodiments of the present disclosure.

FIG. 5 is a diagram illustrating a region determination operation according to an embodiment of the present disclosure.

In the present embodiment, one bank is divided into a plurality of regions with substantially the same size. The number of regions may be changed according to an embodiment.

In the present embodiment, the number of regions is four, and the size of one region corresponds to ¼ of the number of all row addresses of a bank.

In the present embodiment, refresh operations for the row addresses are sequentially performed in an increasing direction of a row address, and in FIG. 5, it is assumed that the row address is increased downward.

In the present embodiment, a region corresponding to a first row address RRA corresponding to a request is determined based on a distance D between the first row address RRA and a second row address LRRA in which refresh has been finally performed.

When the first row address RRA is larger than the second row address LRRA, the distance D is set as a difference between the first row address RRA and the second row address LRRA. On the other hand, when the first row address RRA is smaller than the second row address LRRA, the distance D is set as a value obtained by subtracting the difference between the first row address RRA and the second row address LRRA from the number L of all row addresses.

In FIG. 5, a plurality of regions are respectively indicated by R0, R1, R2, and R3 in an order in which a time lapsed (e.g., an amount of time that has lapsed) after a refresh operation is completed is relatively short. That is, among the regions R0, R1, R2, and R3, the region R0 has the shortest time lapsed after the refresh operation is completed, and the region R3 has the longest time lapsed after the refresh operation is completed.

A region to which the first row address RRA belongs may be decided using the size of each region (the number of row addresses included in each region, e.g., L/4) and the distance D.

When a region to which a row address belongs is decided as described, a value of a timing parameter corresponding to the row address is designated according to a time lapse of the decided region.

In this embodiment, since the time lapse of the region R0 is shorter than the time lapse of the region R3, a value of a timing parameter (for example, tRAS) applied in order to access a row address belonging to the region RU may be designated to be smaller than a value of a timing parameter (for example, tRAS) applied in order to access a row address belonging to the region R3.

Figure 6:
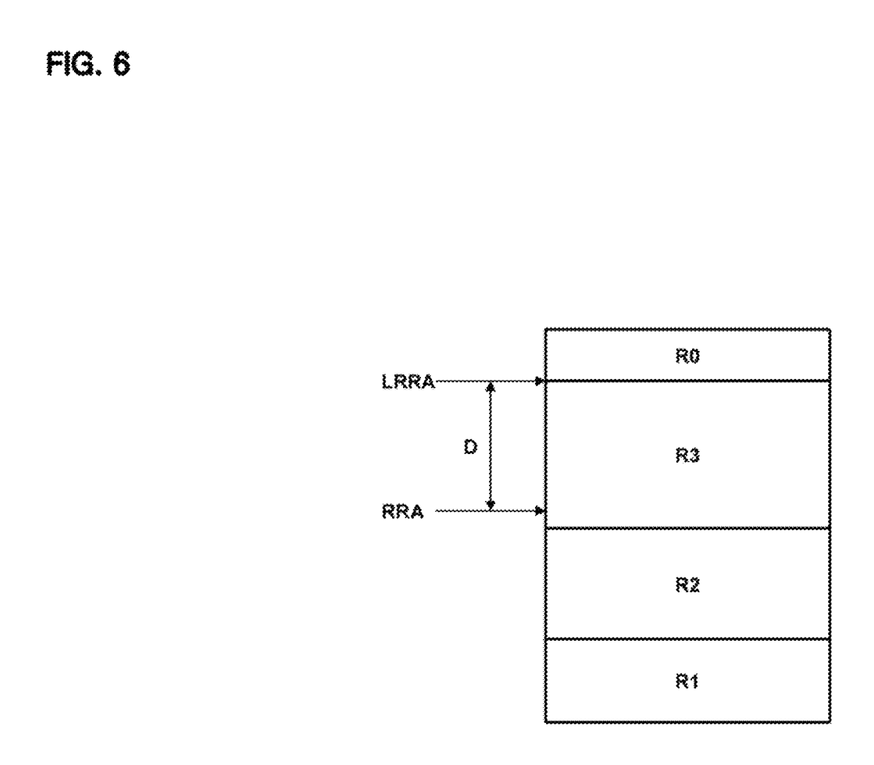

FIG. 6 is a diagram illustrating a region determination operation according to another embodiment of the present disclosure.

The embodiment of FIG. 6 is different from the embodiment of FIG. 5 in that the sizes of regions are set to be different from one another.

In the embodiment of FIG. 6, the sizes of the regions have a ratio of N (R0):N (R1):N (R2):N (R3)=2:3:4:6. This indicates that the sizes of the regions are set to be smaller as the time lapsed after each refresh becomes smaller. The ratio of the sizes of the regions may be differently set according to an embodiment.

In the embodiment of FIG. 6, a value of a timing parameter (for example, tRAS) applied in order to access a row address belonging to the region RU may be designated to be smaller than a value of a timing parameter (for example, tRAS) applied in order to access a row address belonging to the region R3.

Figure 7:
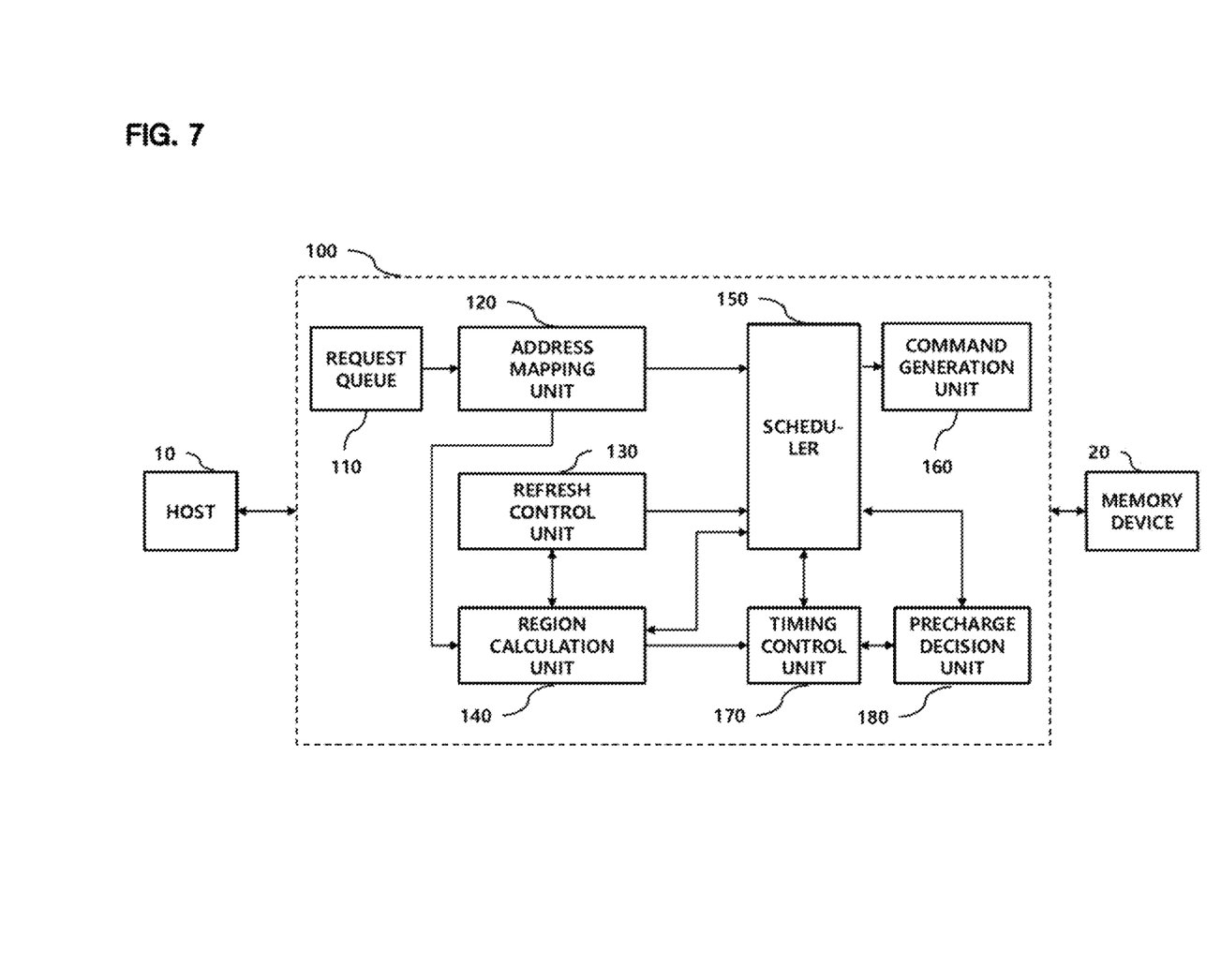
FIG. 7 is a block diagram of a memory system including a memory controller according to another embodiment of the present disclosure.

FIG. 7 is a block diagram of a memory system including a memory controller according to another embodiment of the present disclosure.

In the embodiment illustrated in FIG. 7, a memory controller 200 is substantially the same as the memory controller 100 of FIG. 5, except that a precharge decision circuit 180 is further provided.

The precharge decision circuit 180 decides whether the scheduler 150 controls a precharge operation to be performed at the point in time (e.g. "time point") at which row access is ended.

In more detail, when a request for performing row access corresponding to a row address that is substantially the same as a currently input row address does not exist in the request queue 110, the scheduler 150 controls a precharge operation to be performed on a row designated by the row address or controls the precharge operation not to be performed on the row, according to a decision result of the precharge decision circuit 180. In the present embodiment, the precharge decision circuit 180 compares a row hit rate for a predetermined time with a critical value, and provides a comparison result to the scheduler 150.

The row hit rate is calculated by continuously monitoring operations corresponding to a predetermined number of recently input requests, and is expressed by Equation 1 below.

Hit rate=(the number of column accesses-the number of row accesses)/the number of column accesses <Equation 1>

In Equation 1 above, the hit rate indicates the number of times by which a column has been accessed without accessing a row among the entire column accesses.

The critical value compared with the row hit rate is provided as a function of a timing condition, and in the present embodiment, the critical value is expressed by Equation 2.

Critical value=tRP/(tRCD+tRP) <Equation 2>

In an embodiment of the present disclosure, since a value of a timing parameter is changed according to a row address, the precharge decision circuit 180 newly calculates a critical value by using timing parameter values corresponding to a row address on which a precharge operation is to be performed, with reference to an operational result of the timing control circuit 170, and compares the critical value with the row hit rate of Equation 1 above.

In the present embodiment, when the row hit rate exceeds the critical value, the scheduler 150 omits the precharge operation and opens a row. On the other hand, when the row hit rate does not exceed the critical value, the scheduler 150 performs the precharge operation and closes a row.

Figure 8:
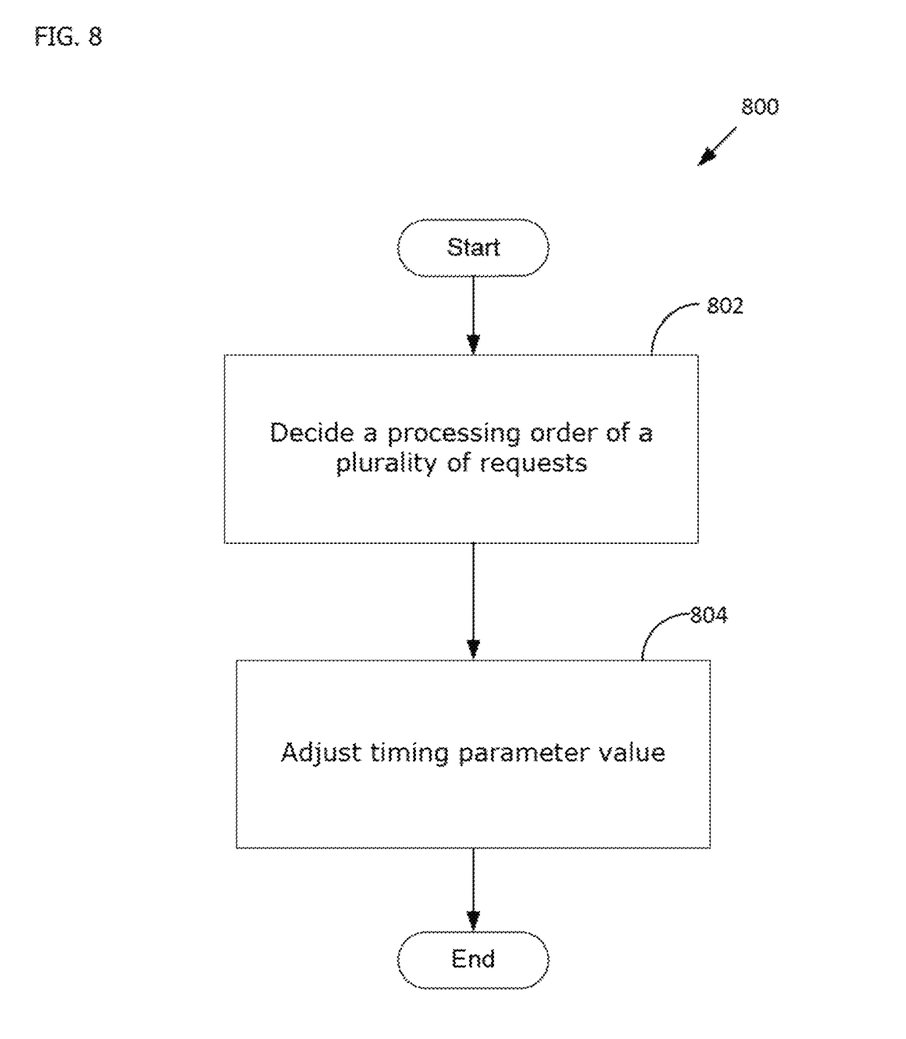
FIG. 8 is a flow process according an embodiment of the present disclosure.

Referring to FIG. 8 which illustrates a flow process 800 in accordance with one embodiment. In various embodiments, the flow process may be implemented by the memory system 100 of FIG. 4 or the memory system 200 of FIG. 7. For the embodiment, the flow process 800 may include an operation 802 for deciding (e.g., as decided by the scheduler 150) a processing order of a plurality of requests provided from an external device (e.g., the host 10) with reference to a timing parameter value for each of the requests. The flow process 800 may further include an operation 804 for adjusting (e.g., as adjusted by the timing control circuit 170) the timing parameter value according to a corresponding address to access the memory device 20, the corresponding address being used to process a corresponding request of the plurality of requests.

While certain embodiments have been described above, it will be understood to those skilled in the art that the embodiments described are by way of example only. Accordingly, the memory controller described herein should not be limited based on the described embodiments. Rather, the memory controller described herein should only be limited in light of the claims that follow when taken in conjunction with the above description and accompanying drawings.

What is claimed is:

1. A memory controller comprising:
   a scheduler that selects an operation among a plurality of operations each corresponding to a request provided from an external device; and
   a timing control circuit that adjusts a value of a timing parameter,
   wherein the scheduler notifies the timing control circuit of the selected operation,
   wherein the timing control circuit adjusts a value of a timing parameter designated to the selected operation according to a requested address used for processing a request corresponding to the selected operation,
   wherein the selected operation is a row access operation,
   wherein the timing control circuit adjusts the value of the timing parameter according to an amount of time that has lapsed after a refresh operation at the requested address was completed, and
   wherein the value of the timing parameter decreases when the amount of time decreases.

2. The memory controller according to claim 1, further comprising:
   a region determination circuit that divides a plurality of addresses used to access a bank of a memory device into a plurality of regions according to an amount of time that has lapsed after a refresh operation corresponding to each of the addresses was completed, and decides a region to which the requested address belongs among the plurality of regions,
   wherein the timing control circuit adjusts the value of the timing parameter according to the region to which the requested address belongs.

3. The memory controller according to claim 2, wherein sizes of the plurality of regions are substantially equal to one another.

4. The memory controller according to claim 2, wherein sizes of the plurality of regions are different from one another.

5. The memory controller according to claim 4, wherein a size of each of the plurality of regions is increased according to the increase of an amount of time that has lapsed after a corresponding refresh operation was completed.

6. The memory controller according to claim 1, further comprising:
   a precharge decision circuit that determines whether to perform a precharge operation with respect to the requested address with reference to a value of a timing parameter designated to the precharge operation,
   wherein, according to a determination result of the precharge decision circuit, the scheduler controls performing the precharge operation with respect to the requested address of a memory device.

7. The memory controller according to claim 6, wherein the precharge decision circuit compares a row hit rate with a critical value and determines whether to perform the precharge operation based on the comparison result.

8. The memory controller according to claim 7, wherein the scheduler does not perform the precharge operation when the row hit rate is larger than the critical value, and performs the precharge operation when the row hit rate is not larger than the critical value.

9. The memory controller according to claim 7, wherein the row hit rate is decided based on the number of row active operations and the number of column accesses for a predetermined time, and the critical value is decided based on a plurality of timing parameters.

10. A method implemented by a memory system, the method comprising:
    selecting an operation among a plurality of operations each corresponding to a request provided from an external device; and
    adjusting a value of a timing parameter designated to the selected operation according to a requested address for processing a request corresponding to the selected operation,
    wherein the selected operation is a row access operation,
    wherein the adjusting a value of a timing parameter includes adjusting the value of the timing parameter according to an amount of time that has lapsed after a refresh operation at the requested address was completed, and
    wherein the value of the timing parameter decreases when the amount of time decreases.

11. The method of claim 10, further comprising:
    dividing a plurality of addresses used to access a bank of a memory device into a plurality of regions according to an amount of time that has lapsed after a refresh operation corresponding to each of the addresses was completed, and deciding a region to which the requested address belongs among the plurality of regions,
    wherein the value of the timing parameter is adjusted according to the region to which the requested address belongs.

12. The method of claim 11, wherein sizes of the plurality of regions are substantially equal to one another.

13. The method of claim 11, wherein sizes of the plurality of regions are different from one another.

* * * * *